United States Patent
Klikic et al.

(10) Patent No.: US 10,375,850 B2
(45) Date of Patent: Aug. 6, 2019

(54) RACK POWER SYSTEM AND METHOD

(71) Applicant: SCHNEIDER ELECTRIC IT CORPORATION, West Kingston, RI (US)

(72) Inventors: Damir Klikic, Waltham, MA (US); Marlon Galsim, Shanghai (CN); William R. Manning, Littleton, MA (US)

(73) Assignee: SCHNEIDER ELECTRIC IT CORPORATION, West Kingston, RI (US)

(*) Notice: Subject to any disclaimer, the term of this patent is extended or adjusted under 35 U.S.C. 154(b) by 128 days.

(21) Appl. No.: 15/452,271

(22) Filed: Mar. 7, 2017

(65) Prior Publication Data
US 2017/0265325 A1 Sep. 14, 2017

Related U.S. Application Data

(63) Continuation of application No. PCT/CN2016/075850, filed on Mar. 8, 2016.

(51) Int. Cl.
  *H02J 7/00* (2006.01)
  *H02J 9/00* (2006.01)
  *H05K 7/14* (2006.01)
  *H02J 9/06* (2006.01)

(52) U.S. Cl.
  CPC ............ *H05K 7/1492* (2013.01); *H02J 9/061* (2013.01); *H05K 7/1489* (2013.01)

(58) Field of Classification Search
  CPC ...... H02J 9/061; H05K 7/1492; H05K 7/1489
  See application file for complete search history.

(56) References Cited

U.S. PATENT DOCUMENTS

| 5,982,652 | A | 11/1999 | Simonelli et al. |
| 7,446,433 | B2 | 11/2008 | Masciarelli et al. |
| 8,952,566 | B2 * | 2/2015 | Harris ............... G06F 1/183 307/66 |

(Continued)

FOREIGN PATENT DOCUMENTS

| CN | 102902339 A | 1/2013 |
| CN | 102918747 A | 2/2013 |
| WO | 2016003410 A1 | 1/2016 |

OTHER PUBLICATIONS

International Search Report and Written Opinion from corresponding PCT/CN2016/075850 dated Dec. 15, 2016.

(Continued)

*Primary Examiner* — Jared Fureman
*Assistant Examiner* — Esayas G Yeshaw
(74) *Attorney, Agent, or Firm* — Lando & Anastasi, LLP

(57) ABSTRACT

According to at least one aspect embodiments herein provide a rack power system for providing DC power to equipment installed in a rack, comprising a first shelf containing a plurality of power supplies, each of the plurality of power supplies configured to receive AC power and to provide DC power to equipment installed in the rack, a second shelf containing a plurality of battery units, each of the plurality of battery units configured to provide DC power, and a controller coupled to the first shelf and the second shelf and configured to control each of the plurality of power supplies and configured to control each of the plurality of battery units.

20 Claims, 8 Drawing Sheets

(56) References Cited

U.S. PATENT DOCUMENTS

| | | | |
|---|---|---|---|
| 8,964,396 B1 | 2/2015 | Dailey et al. | |
| 9,647,491 B2* | 5/2017 | Navarro | H02J 9/06 |
| 2006/0056142 A1 | 3/2006 | Takahashi et al. | |
| 2009/0021078 A1* | 1/2009 | Corhodzic | G06F 1/263 |
| | | | 307/67 |
| 2011/0013348 A1* | 1/2011 | Seibold | G06F 1/189 |
| | | | 361/679.02 |
| 2011/0156480 A1* | 6/2011 | Park | G06F 1/30 |
| | | | 307/23 |
| 2011/0304211 A1* | 12/2011 | Peterson | G06F 1/263 |
| | | | 307/48 |
| 2013/0031381 A1* | 1/2013 | Jau | G06F 1/305 |
| | | | 713/300 |
| 2014/0292167 A1 | 10/2014 | Sojka | |
| 2015/0303419 A1* | 10/2015 | Hachiya | H01M 2/1077 |
| | | | 429/99 |
| 2016/0294204 A1 | 10/2016 | Deokar et al. | |

OTHER PUBLICATIONS

Kala, Samir et al., Technical Specification, OPEN Compute Project, 277Vac US Power Distribution Unit for V2 Open Rack, Jan. 2015, pp. 14.

Kala, Samir et al., Technical Specification, OPEN Compute Project, DC Power Distribution Unit for V2 Open Rack, Jan. 2015, pp. 14.

Kala, Samir et al., Technical Specification, OPEN Compute Project, EU 230Vac Power Distribution Unit for V2 Open Rack, Jan. 2015, pp. 14.

Mills, Steve et al., Technical Specification, Open Compute Project—Open Rack standard V1.1, Jan. 2015, pp. 12.

Sarti, Pieluigi et al., Technical Specification, OPEN Compute Project, BBU Battery Backup Module 3600W for V. Power Shelf, Jan. 2015, pp. 22.

Sarti, Pierluigi et al., Technical Specification, OPEN Compute Project, V2 Power Shelf Specification 6600W @ 12.6V (2+1) Redundant, Jan. 2015, pp. 85.

* cited by examiner

RACK POWER SYSTEM AND METHOD

CROSS-REFERENCE TO RELATED APPLICATION

This application is a continuation of International Application No. PCT/CN2016/075850 filed on Mar. 8, 2016, titled RACK POWER SYSTEM AND METHOD, which is hereby incorporated herein by reference in its entirety for all purposes.

BACKGROUND

1. Field of Invention

At least some embodiments described herein relate generally to systems and methods for providing reliable power to rack-mountable appliances and equipment.

2. Discussion of Related Art

Data centers for computers, servers, communications, and other electronic equipment with centralized or distributed AC backup systems have been in use for a number of years. Typical data centers contain racks and enclosures that provide a platform for such equipment and often provide power, cooling, and connections to communications facilities. Some rack systems provide Alternating Current (AC) from a public or private electrical utility system, often powered through a centralized Uninterruptible Power Supply (UPS), and some provide high voltage Direct Current (DC), such as 240 volt DC or 380 volt DC, while others support a DC power bus with typical voltages of 12 volts or 48 volts, which may be supplied by rectifier and battery modules associated with the data center generally or associated with individual racks and enclosures.

SUMMARY

Various aspects of the present invention relate to methods and apparatuses for rack power systems to provide reliable power to rack-mountable appliances and equipment. At least one aspect of the invention is directed to a rack power system for providing DC power to equipment installed in a rack, comprising a first shelf containing a plurality of power supplies, each of the plurality of power supplies configured to receive AC power and to provide DC power to equipment installed in the rack, a second shelf containing a plurality of battery units, each of the plurality of battery units configured to provide DC power, and a controller coupled to the first shelf and the second shelf and configured to control each of the plurality of power supplies and configured to control each of the plurality of battery units.

According to one embodiment, the plurality of power supplies are configured to provide DC power to a DC power bus having a nominal voltage, and the controller is further configured to control at least one of the plurality of battery units to operate in an online mode to generate a DC voltage less than the nominal voltage.

According to another embodiment, the plurality of power supplies are configured to provide DC power to a DC power bus having a nominal voltage, and the controller is further configured to detect an overload condition and control at least one of the plurality of battery units to operate in an active mode to provide DC power to the DC power bus at the nominal voltage.

According to another embodiment, the plurality of power supplies are configured to provide DC power to a DC power bus having a nominal voltage, and the controller is further configured to detect operation of the rack power system at a power level less than a full power level, and in response, control the first shelf to operate in an efficient mode of operation and control at least one of the plurality of power supplies to operate in a mode in which the at least one of the plurality of power supplies does not provide DC power.

According to another embodiment, the plurality of power supplies are configured to provide DC power to a DC power bus having a nominal voltage, and the controller is configured to detect loss of AC power, and in response, control the plurality of battery units to provide DC power to the DC power bus at the nominal voltage.

According to another embodiment, the first shelf is further configured to accept at least one battery unit, the first shelf and the second shelf are each configured to be slidingly mounted within the rack; and the first shelf and the second shelf are each configured to couple to the DC power bus when in a fully inserted position.

According to another embodiment, each of the plurality of power supplies has the same power rating as each of the plurality of battery units.

Another aspect of the invention is directed to a method for providing power to equipment installed in a rack, the method comprising mounting a first shelf into the rack, the first shelf containing a plurality of power supplies, each of the plurality of power supplies configured to receive AC power and to provide DC power to equipment installed in the rack, mounting a second shelf into the rack, the second shelf containing a plurality of battery units, each of the plurality of battery units configured to provide DC power, and independently controlling each of the plurality of power supplies and each of the plurality of battery units.

According to one embodiment, the method further comprises controlling at least one of the plurality of power supplies to provide DC power at a nominal voltage to a DC bus in the rack, and controlling at least one of the plurality of battery units to operate in an online mode and generate a DC voltage less than the nominal voltage.

According to another embodiment, the method further comprises controlling at least one of the plurality of power supplies to provide DC power at a nominal voltage to a DC bus in the rack, detecting an overload condition, and controlling at least one of the plurality of battery units to provide DC power to the DC bus at the nominal voltage in response to the overload condition.

According to another embodiment, the method further comprises controlling at least one of the plurality of power supplies to provide DC power at a nominal voltage to a DC bus in the rack, and detecting operation of the first shelf at a level less than a full power level, and in response controlling at least one of the plurality of power supplies to operate in a mode in which the at least one of the plurality of power supplies does not provide DC power to the DC bus.

According to another embodiment, the method further comprises controlling at least one of the plurality of power supplies to provide DC power at a nominal voltage to a DC bus in the rack, and detecting a loss of AC power, and in response controlling the plurality of battery modules to provide DC power to the power bus at the nominal voltage.

According to another embodiment, the method further comprises mounting a DC bus in the rack, wherein the first shelf further contains at least one battery unit, wherein mounting a first shelf into the rack includes sliding the first shelf into the rack and coupling a connector of the first shelf with the DC bus, and wherein mounting a second shelf into the rack includes sliding the second shelf into the rack and coupling a connector of the second shelf with the DC bus.

According to another embodiment, each of the plurality of power supplies has the same power rating as each of the plurality of battery units.

Another aspect of the invention is directed to an equipment rack comprising a frame, a pair of mounting rails coupled to the frame, a first shelf mounted to the mounting rails and containing a plurality of power supplies, each of the plurality of power supplies configured to receive AC power and to provide DC power to equipment installed in the rack, a second shelf mounted to the mounting rails and containing a plurality of battery units, each of the plurality of battery units configured to provide DC power, and a controller coupled to the first shelf and the second shelf and configured to control each of the plurality of power supplies and configured to control each of the plurality of battery units.

According to one embodiment, the equipment rack further comprises a DC power bus mounted in the equipment rack and configured to distribute DC power to equipment mounted to the rails in the equipment rack, wherein the plurality of power supplies are configured to provide DC power to the DC power bus having a nominal voltage, and wherein the controller is further configured to control at least one of the plurality of battery units to operate in an online mode to generate a DC voltage less than the nominal voltage.

According to another embodiment, the equipment rack further comprises a DC power bus mounted in the equipment rack and configured to distribute DC power to equipment mounted to the rails in the equipment rack, wherein the plurality of power supplies are configured to provide DC power to the DC power bus having a nominal voltage, and wherein the controller is further configured to detect an overload condition and control at least one of the plurality of battery units to operate in an active mode and provide DC power to the DC power bus at the nominal voltage.

According to another embodiment, the plurality of power supplies are configured to provide DC power to a DC power bus having a nominal voltage, and wherein the controller is further configured to detect operation at a power level less than a full power level, and in response, control the first shelf to operate in an efficient mode of operation and control at least one of the plurality of power supplies to operate in a mode in which the at least one of the plurality of power supplies does not provide DC power.

According to another embodiment, the plurality of power supplies are configured to provide DC power to a DC power bus having a nominal voltage, each of the plurality of power supplies has the same power rating as each of the plurality of battery units, and the controller is configured to detect loss of AC power, and in response, control the plurality of battery modules to provide DC power to the power bus at the nominal voltage.

According to another embodiment, the first shelf and the second shelf are each further configured to be slidingly mounted to the mounting rails, and the first shelf and the second shelf are each further configured to couple to the DC power bus when slid to a fully inserted position.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
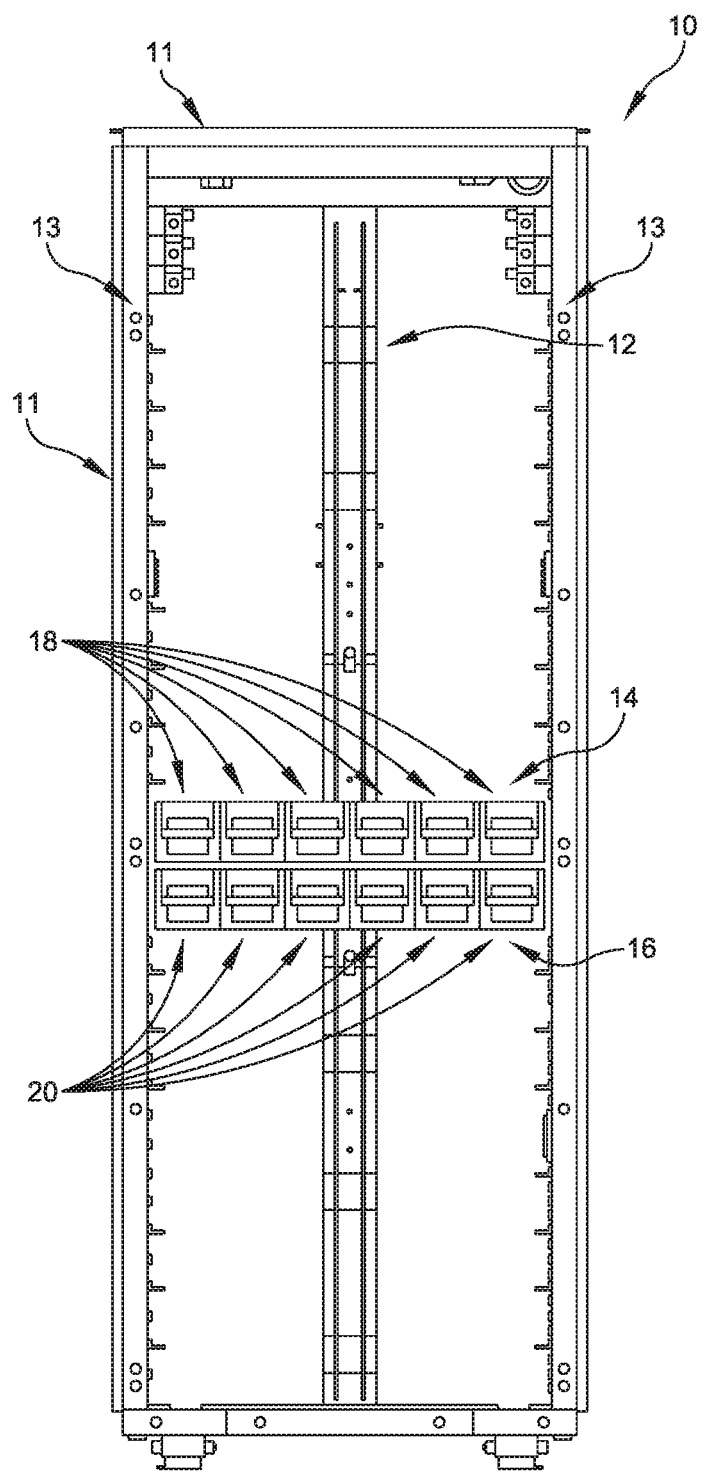
FIG. 1 is an illustration of a rack with shelves according to aspects of the current invention.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

In many data center environments, equipment is installed in standardized equipment enclosures, for example as defined by the Electronic Industries Alliance EIA-310 specification or by the Open Rack Standard as part of the Open Compute Project (OCP). As used herein, the term "enclosure" describes a structure which either partially or completely encloses one or more appliances and/or other pieces of equipment (e.g., rack-mountable equipment). A rack is a form of enclosure.

Rack power systems typically provide equipment installed in the rack with either AC power derived from an electrical utility system or DC power derived from a power supply via a rectifier. More specifically, AC utility systems typically supply a nominal AC voltage, for example 120 or 240 volts RMS, at a nominal frequency, for example 60 Hz or 50 Hz. AC-based equipment racks may be powered directly by an AC utility system, but are commonly connected to the AC utility through an Uninterruptible Power Supply (UPS). In a situation where a rack provides AC power to equipment installed in the rack, such equipment commonly includes internal power supplies that convert the AC power to various DC voltages. Other, DC-based, rack power systems may be configured to provide DC power to the equipment installed in the rack. Because the utility, or other power source, coupled to the rack is typically an AC source, such DC-based systems often include a rectifier or AC-DC converter supplied as part of the rack or as an additional piece of equipment and is generally referred to as a power supply.

Some challenges exist with existing rack power systems. For example, power supplies and backup batteries are typically provided in a fixed configuration to provide a single power level or wattage and have a fixed design in terms of redundancy or battery capacity. A lack of flexibility may result in a user having to install a relatively expensive rack power system that is over-engineered for the requirements of the user and corresponding equipment. The lack of flexible design and installation options may also lead to under-engineered situations where the rack power systems fall short in terms of redundancy or backup capacity.

In one aspect, a rack power system with a flexible architecture is described herein that allows for modularity and configurability. The system allows for scalability of power and allows installation options to be matched to the power requirements of the equipment, to the redundancy requirements of the equipment and the user, and to any budget constraints. The rack power system described herein also allows for scalability and growth over time such that power options may be changed as budgets allow or as requirements change.

In accordance with at least one embodiment, FIG. 1 is an illustration of an equipment rack 10 having a frame 11, a power bus 12, and mounting rails 13. Also shown are a power shelf 14 and a battery shelf 16 installed therein. The power shelf 14 is shown with six power modules that are power supply units 18 (PSU's) and the battery shelf 16 is shown with six power modules that are battery backup units 20 (BBU's). A Rack Management Controller (RMC) may also be provided as discussed below.

The power bus 12 is a bus bar mounted to the frame 11 and running substantially the full height of the rack 10, providing electrical conductors that allow for DC electrical power to be distributed to equipment mounted in the rack 10. Equipment such as blade servers, network gear, and the like, are accommodated to be mounted to the mounting rails 13 and make an electrical connection to the power bus 12. The mounting rails 13 typically provide holes to accept fasteners for mounting equipment but may provide alternate mounting means. The smallest unit of space along the mounting rails for mounting equipment is typically called a rack unit, and one rack unit is typically referred to as 1U. For example, a piece of equipment taking up three such spaces may be referred to as 3U equipment. The shelves 14, 16 are mounted to the mounting rails 13 in substantially the same fashion as other equipment and are electrically connected to the power bus 12. Each of shelves 14, 16 provides connections to convey power to the power bus 12 from one or more power modules, such as the power supply units 18 or the battery backup units 20. In some embodiments the shelves 14, 16 may be mounted to the mounting rails 13 with a slide that allows the shelves 14, 16 to be easily and temporarily pulled forward, out of the rack, for maintenance, and slid back into the rack to engage with the power bus 12. In other embodiments, other forms of a power bus 12 and/or cabling may be used to distribute DC power to equipment in the rack 10.

Each of the shelves 14, 16 provide physical support for power modules to be mounted in the rack 10 and also provide electrical connections for power and communications. A power shelf 14 with power supply units 18 installed provides input AC power to the power supply units 18. The shelves 14, 16 provide an electrical connection to the power bus 12 to convey output power from the power supply units 18 and the battery backup units 20. The shelves 14, 16 also provide connections for communications to a controller, discussed below.

Figure 1A:
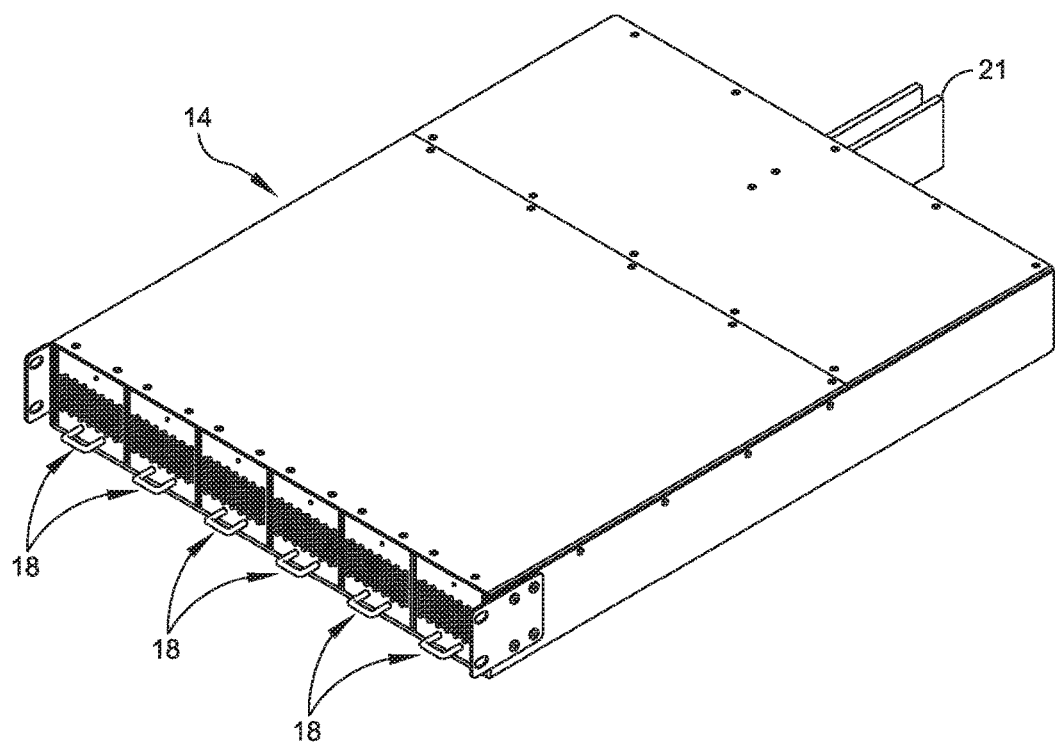
FIG. 1A is an illustration of a power shelf according to aspects of the current invention.

Referring to FIG. 1A, a power shelf 14 is illustrated in a perspective view. As in FIG. 1, six power supply units 18 are shown installed in the power shelf 14. A mating connector 21 provides an electrical connection to the power bus 12 when the power shelf 14 is installed in the rack 10. As mentioned above, the power bus 12 may take other forms and mating connector 21 may take various forms to accommodate other embodiments of the power bus 12.

Figure 1B:
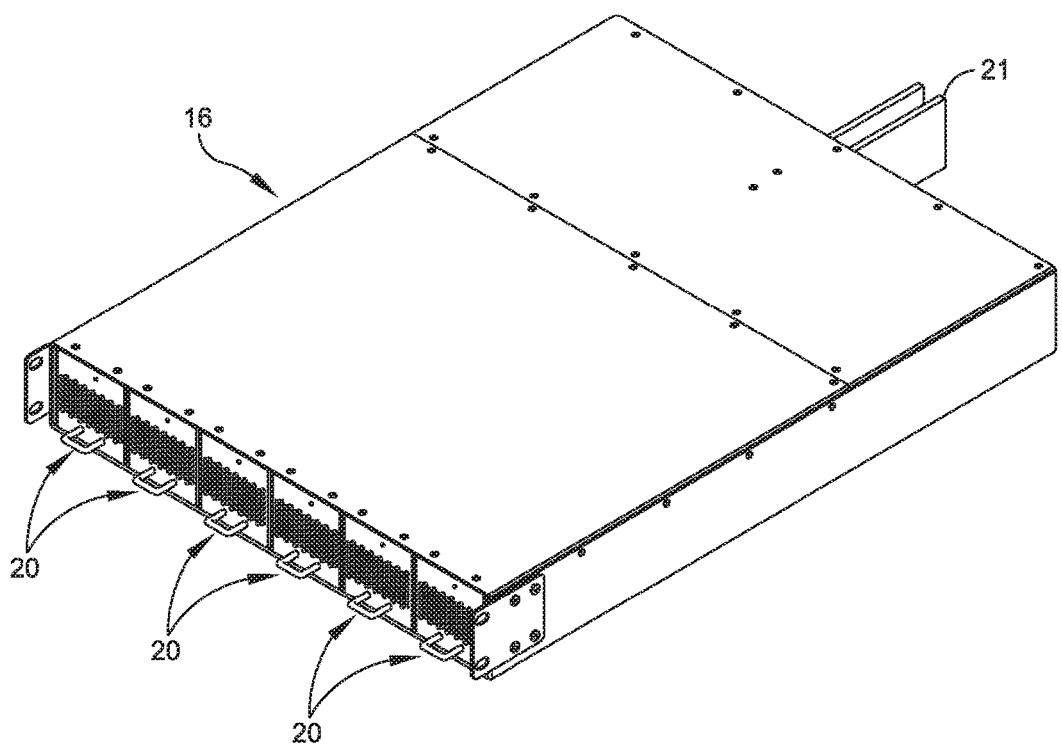
FIG. 1B is an illustration of a battery shelf according to aspects of the current invention.

Referring to FIG. 1B, a battery shelf 16 is illustrated in a perspective view. As in FIG. 1, six battery backup units 20 are shown installed in the battery shelf 16. A mating connector 21 provides an electrical connection to the power bus 12 when the battery shelf 16 is installed in the rack 10. As mentioned above, the power bus 12 may take other forms and mating connector 21 may take various forms to accommodate other embodiments of the power bus 12.

Each power supply unit 18 is a power module that is configured to be coupled to an AC source, such as mains or utility power, which might be connected through data center distribution facilities, and each power supply unit 18 is configured to convert the AC power to a form suitable for the rack and rack-mounted equipment. For example, in one embodiment, each power supply unit 18 converts AC power to a regulated nominal 12.5 volts DC power, which is provided to the power bus 12 such that at least 12.0 volts DC is provided to the rack-mounted equipment. In alternate embodiments the voltage provided by a power supply unit 18 may be configured differently.

Each battery backup unit 20 is a power module that uses stored energy from a storage element to provide suitable power for the rack and rack-mounted equipment. As with the power supply units 18, each battery backup unit 20 may provide 12.5 volts DC to the power bus 12. In alternate embodiments the voltage provided by a battery backup unit 20 may be configured differently. In general, the battery backup units 20 provide power upon detection of a loss of power from the power supply units 18 or upon detection of a loss of AC main power. The battery backup units 20 will also provide power under other circumstances, and when instructed by a controller, to be discussed below. Storage elements will typically be electrochemical storage elements, such as a rechargeable battery or a fuel cell, but may include other systems for storing energy, such as kinetic or mechanical storage elements (e.g., a flywheel), or electrical storage elements such as a super capacitor. A battery backup unit 20 will typically include elements in addition to the storage element, such as conversion equipment to adapt or provide a specific voltage, a battery management system, and environmental sensors.

In accordance with various embodiments, the power shelf 14 may have more or less than six power supply units 18 and may also have one or more battery backup units 20. The battery shelf 16 may also have more or less than six battery backup units 20 and may have one or more power supply units 18. Also, the rack 10 may have only one of either a power shelf 14 or a battery shelf 16 installed, or may have additional shelves 14, 16 installed. The number of shelves, power supply units, and battery backup units can be any number and will normally be determined by the maximum required power of the equipment and the level of redundancy and backup power required or desired.

For example, if the power requirements of the rack 10 are such that a number N of power supply units 18 are necessary, a redundant configuration might have N+1 power supply units 18 such that an additional power supply unit 18 is available as a redundant power supply, or an alternate configuration may have 2N power supply units 18 such that there is a one-to-one redundant power supply unit 18 for every power supply necessary to supply the needs of the equipment in the rack 10. Any desired redundancy configuration or number of power supply units 18 may be selected based on the needs of the user. The power supply units 18 can each supply the same voltage and power rating (e.g., wattage), or may have differing power ratings, and the power supply units 18 can be electrically connected in parallel to power bus 12.

As discussed above, the battery shelf 16 may contain any number of battery backup units 20 and may also be arranged in any redundant configuration. A battery backup unit 20 may act as a backup or redundant power source when one or more of the power supply units 18 fail, or a battery backup unit 20 may act as a backup or redundant power source when another battery backup unit 20 fails. Additionally, one or more battery backup units 20 may provide power only for a period of time, for example to accommodate a temporary overload condition, as will be discussed later, or to allow time for equipment to properly shut down following a power failure. Any desired redundancy configuration or number of battery backup units 20 may be selected based on the needs of the user/system. The needs of the system and the equipment installed in the rack 10 will determine the number of battery backup units 20 that may be preferable. The battery backup units 20 can each supply the same voltage and power ratings (e.g., wattage), or may have differing power ratings, and the battery backup units 20 can be electrically connected in parallel to power bus 12.

The power supply units 18 and the battery backup units 20 can all supply the same voltage and power levels and be connected in parallel to power bus 12 via the shelves 14, 16 in which they are installed. In one embodiment, the battery backup units 20 have the same power rating (e.g., wattage) as the power supply units 18, which allows the user to select an identical number of battery backup units 20 as power supply units 18 and be confident that the system configuration has sufficient battery backup capacity to provide backup power in the case of a failure of main AC power or of any or all of the power supply units 18.

Figure 2:
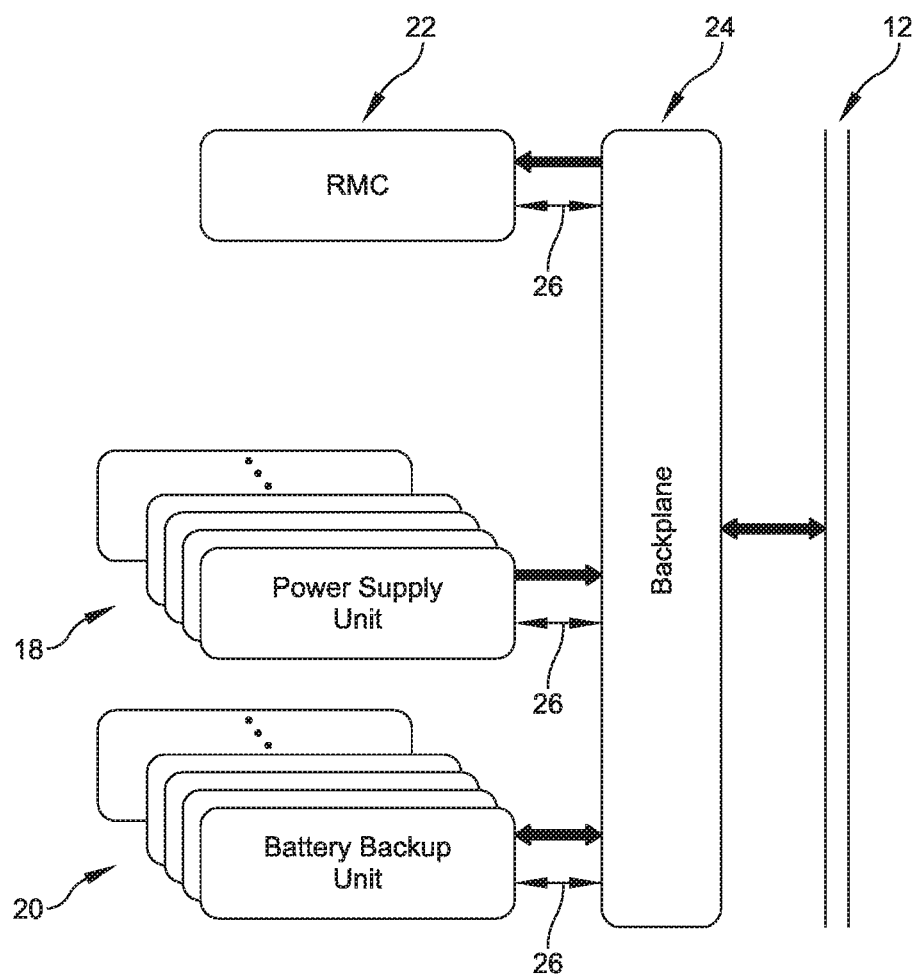
FIG. 2 is a block diagram of a rack power system architecture according to aspects of the current invention.

FIG. 2 is a block diagram showing an architecture of the rack power system in accordance with an aspect of the invention. Shown are a plurality of power supply units 18, a plurality of battery backup units 20, a rack management controller (RMC) 22, a backplane 24, and the power bus 12.

The power supply units 18 and battery backup units 20 may be installed on one or more shelves 14, 16 (e.g., as discussed above with respect to FIG. 1). In accordance with this embodiment, the backplane 24 provides at least a portion of a communications and control channel 26 to allow communication among and between the power supply units 18, the battery backup units 20, and the RMC 22. In various embodiments, the backplane 24 may be a distributed structure whose components are associated with one or more of the shelves 14, 16, the RMC 22, and/or the individual power supply units 18 and battery backup units 20. In other embodiments the backplane 24 may be distinct and allow each of the shelves 14, 16, and the RMC 22 to couple to the backplane 24.

The RMC 22 performs various functions, as further described below, and in various embodiments may be instantiated as a standalone component, as part of the backplane 24, or incorporated into one or more of the shelves 14, 16, or any other suitable location. The RMC 22 provides logic suitable for performing functions as further described below. In various embodiments, the RMC 22 may additionally perform functions similar to rack management controllers of other rack enclosures, or other components may perform such functions. The RMC 22 may take the form of hardware circuitry, programmable logic circuits, micro-controllers, processors, storage, software, or any combination of these.

The control channel 26 allows for communication and control signals among and between the shelves 14, 16, the power supply units 18, the battery backup units 20, and the RMC 22. Each of the shelves 14, 16, power supply units 18, battery backup units 20, and the RMC 22 have interfaces to communicate via the control channel 26. The control channel 26 consists of a Power Management Bus (PMBus™) and additional signaling connections as described further below. The control channel 26 allows command and control of the power supply units 18 and the battery backup units 20 by the RMC 22 and further allows data collection from the power supply units 18 and the battery backup units 20. Each of the power supply units 18 and the battery backup units 20 have internal controllers capable of communicating with the RMC 22 via the control channel 26. According to some embodiments, the control channel 26 may include an alternate bus or may be a wired or wireless communications network, individual signal lines, or any other suitable communications channel. PMBus™ is a trademark of System Management Interface Forum (SMIF), Inc.

Figure 3:
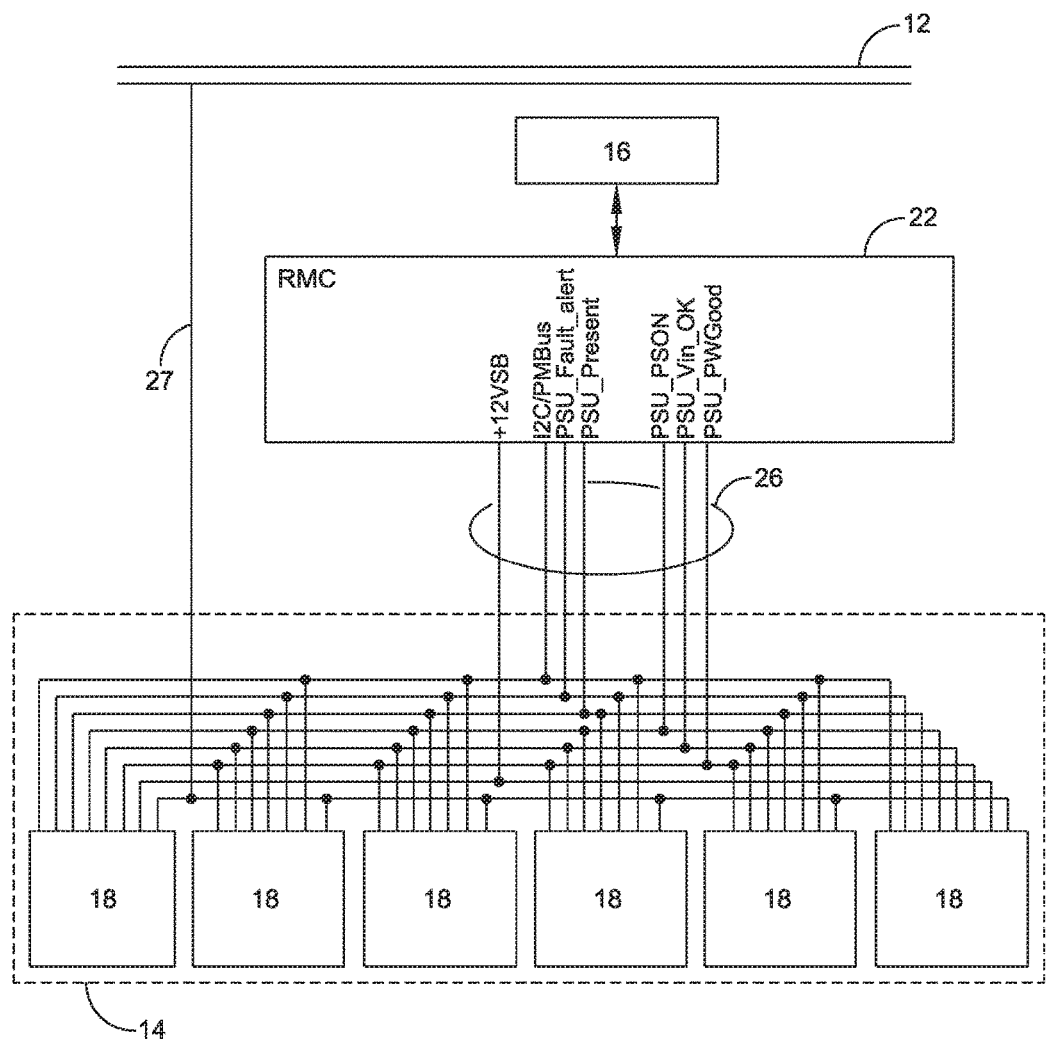
FIG. 3 is a block diagram of a power shelf adapted with power supply units according to aspects of the current invention.

FIG. 3 is a block diagram showing additional schematic detail of the control channel 26 as it relates to power supply units 18. Shown are six power supply units 18 as part of a power shelf 14 coupled to the RMC 22 via the control channel 26. The RMC 22 is further coupled via the control channel 26 to an additional battery shelf 16, which may contain battery backup units 20 or additional power supply units 18. Also shown is the power bus 12 and a connection 27 to convey power from the power supply units 18 to the power bus 12.

With continuing reference to FIG. 3, the control channel 26 is capable of relaying signals and information between power supply units 18 and the RMC 22. Signals conveyed by the control channel 26 with respect to the power shelf 14 and the power supply units 18 are annotated in Table 1. The control channel 26 may convey additional information as discussed further below, and in particular a PMBus™ is capable of conveying measured information or other data.

TABLE 1

| | |
|---|---|
| I2C/PMBus | Inter-IC bus, may be a PMBus™, to communicate data between PSU's and the controller. |
| PSU_Present | Indicates to the controller that a PSU is present (installed) and ready to operate. |
| PSU_Fault_Alert | Indicates to the controller that there is a failure in a PSU or the power shelf in which it is installed. |
| PSU_PS_ON | Indicates to a PSU that it should be operational, supplying power to the power bus, e.g., power bus 12. |
| PSU_Vin_OK | Indicates to the controller that input power, e.g., mains AC, is within operational limits, e.g., voltage, stability. |
| PSU_PGood | Indicates to the controller that output power of PSU meets requirements, e.g., 12.5 v DC. |

Figure 4:
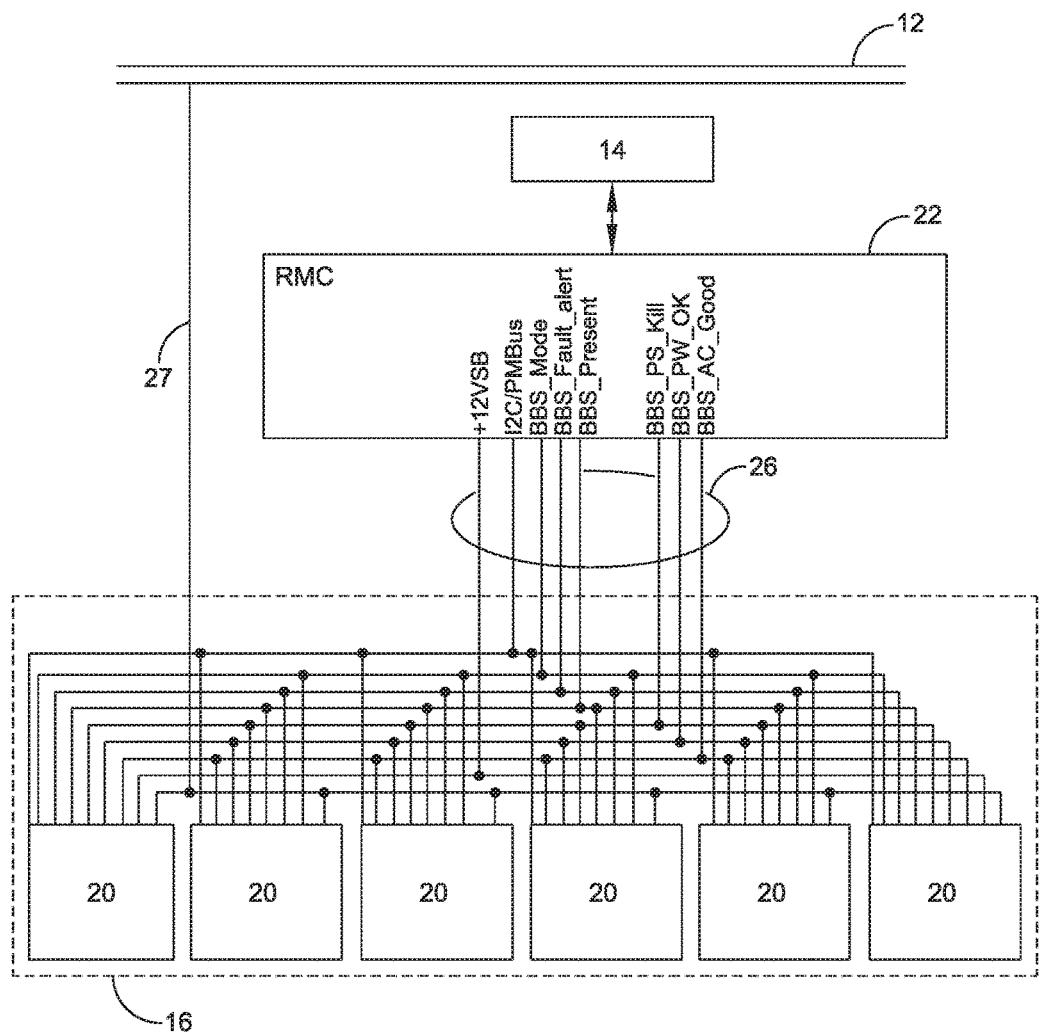
FIG. 4 is a block diagram of a battery shelf adapted with battery backup units according to aspects of the current invention.

FIG. 4 is a block diagram showing additional schematic detail of the control channel 26 as it relates to battery backup units 20. Shown are six battery backup units 20 as part of a battery shelf 16 coupled to the RMC 22 via the control channel 26. The RMC 22 is further coupled via the control channel 26 to an additional power shelf 14, which may contain power supply units 18 or additional battery backup units 20. Also shown is the power bus 12 and a connection 27 to convey power from the battery backup units 20 to the power bus 12.

With continuing reference to FIG. 4, the control channel 26 relays signals and information between the battery backup units 20 and the RMC 22. Signals conveyed by the control channel 26 with respect to the battery shelf 16 and the battery backup units 20 are annotated in Table 2. The control channel 26 may convey additional information as discussed further below, and in particular a PMBus™ is capable of conveying measured information or other data. A battery shelf 16 equipped with one or more battery backup units 20 may be referred to as a battery backup shelf (BBS).

TABLE 2

| | |
|---|---|
| I2C/PMBus | Inter-IC bus, may be a PMBus™, to communicate data between BBU's and the controller. |
| BBS_Present | Indicates to the controller that a BBU is present (installed) and ready to operate. |
| BBS_Fault_Alert | Indicates to the controller that there is a failure in a BBU or the power shelf in which it is installed. |
| BBS_PS_Kill | Indicates to a BBU, or the power shelf in which it is installed, that it should be in a shutdown or offline state or mode in which it does not supply power to the power bus. |
| BBS_Mode | Indicates to a BBU what operational mode it should be in, as described further below. |
| BBS_PW_OK | Indicates to the controller that a BBU is operational in active mode providing output power according to requirements, e.g., 12.5 v DC. |
| BBS_AC_Good | Indicates to BBU that main power, e.g., mains AC, to PSU modules is within operational limits, e.g., voltage, stability. |

The control channel 26 allows for communication between the RMC 22 and the power supply units 18 and the battery backup units 20, as shown in FIGS. 3 and 4. While the control channel 26 is shown as a simple bus of signal lines connected in parallel between power modules, the control channel 26 allows communication with individual power supply units 18 and with individual battery backup units 20. A single cable to a shelf 14, 16 may establish the control channel 26, and communication to individual power modules (i.e., power supply units 18 and/or battery backup units 20) may be consolidated, for example, by a multiplexer or other components of the control channel 26, or a communications controller associated with the shelf 14, 16, or additional signal lines or address lines that select which power module is to be addressed.

Figure 5:
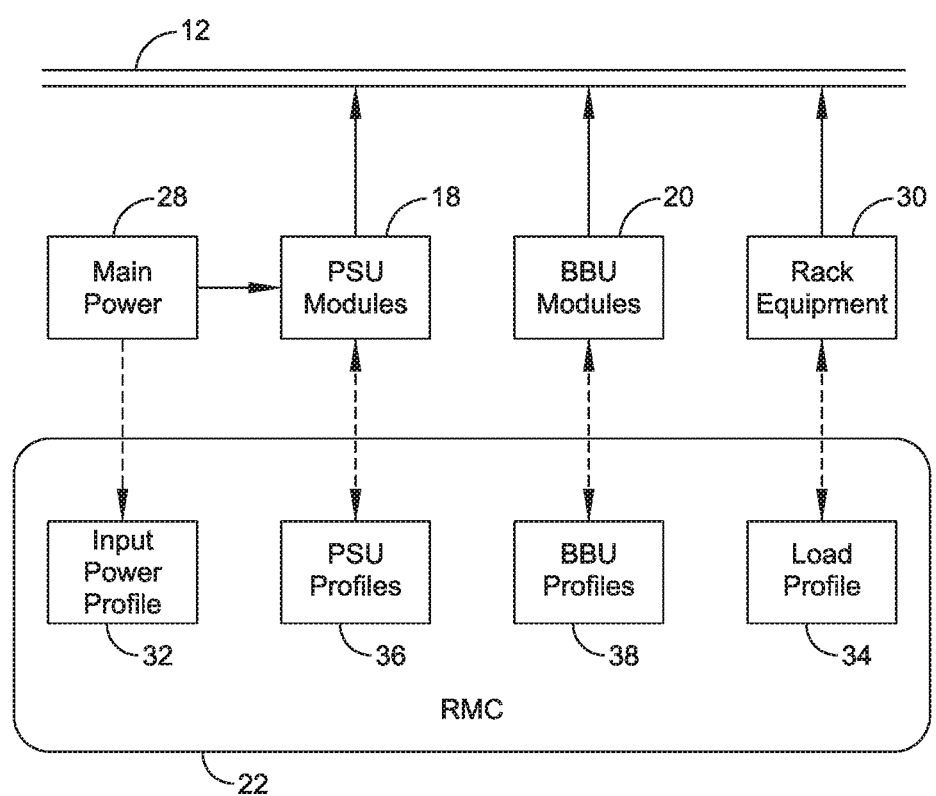
FIG. 5 is a block diagram illustrating the control architecture of a rack power system according to aspects of the current invention.

FIG. 5 is a block diagram showing a system architecture according to an embodiment of the invention. FIG. 5 shows a main power 28, power supply units 18, the power bus 12, battery backup units 20, the RMC 22, and rack-mounted equipment 30. As should be understood from discussion above, main power 28 provides power to one or more of the power supply units 18, which convert the main power 28 to a form suitable for the equipment 30. The power is conveyed from the power supply units 18 to the power bus 12, from which the equipment 30 draws power for operation. In a normal operating state, each of the battery backup units 20 may be in an offline or standby mode neither drawing power nor providing power, or may be drawing power from the power bus 12 to charge. At various times, the battery backup units 20 may provide power to the power bus 12 in addition to power supply units 18 or instead of power supply units 18, for example during a failure of main power 28.

Still with reference to FIG. 5, the RMC 22 maintains an input power profile 32, a load profile 34, a PSU profile 36, and a BBU profile 38. In general, these profiles include current operating statuses and/or conditions of the main power 28, the equipment 30, power supply units 18, and battery backup units 20, respectively. Additionally each of the profiles may include information about their respective element's characteristics, such as: capacity, efficiency, wattage, maximum limits, etc., as will be described below where relevant. Such characteristic information may be remotely retrieved, stored in a database, pre-loaded into memory, stored in memory associated with the element to which they pertain, determined operationally, input by a user through the RMC 22, or available by any other suitable method.

The input power profile 32 provides information about the AC main power 28 which may include: root-mean-square (RMS) voltage or current, instantaneous voltage or current, phase relationships between voltage and current, frequency, frequency profile (for example, power or RMS values of harmonics), total harmonic distortion (THD), or other indicators of stability. In some embodiments, sensors may be used in the rack 10 to detect, measure, or otherwise provide the input power profile 32.

The load profile 34 provides information about the equipment 30 and in particular provides information about the power being drawn, or demanded, from the power bus 12 by the equipment 30. The load profile 34 information may include: total power or wattage, voltage, current, ripple, and other information indicative of the power drawn or stability of the power provided to the equipment 30. In some embodiments, sensors may be used in the rack 10 to detect, measure, or otherwise provide the load profile 34.

The PSU profile 36 includes information about various power supply units 18 and in particular may include the operational status of any one or more of the power supply units 18, such as whether it is actively providing power to the power bus 12 and at what voltage and current, or at what percentage of rated capacity, for example. Additional PSU profile 36 information may include the rated capacity of a power supply unit 18 or efficiency information, such as an efficiency curve, of a power supply unit 18, either of which may be provided by the power supply unit 18 or may be pre-loaded in memory of, e.g., the RMC 22, or may be retrieved from a database or otherwise made available. In some embodiments, sensors may be used in the rack 10 to detect, measure, or otherwise provide the PSU profile 36 information.

The BBU profile 38 includes information about various battery backup units 20 and in particular may include the operational status of any one or more of the battery backup units 20, such as battery charge levels and current mode of operation, e.g., offline, charging, ready, standby, online, active, etc. If a battery backup unit 20 is actively presenting voltage to the power bus 12, the profile information may include at what voltage and current, or at what percentage of rated capacity, for example. Additional BBU profile 38 information may include the rated capacity of a battery backup unit 20 or efficiency information, such as an efficiency curve, of a battery backup unit 20, either of which may be provided by the battery backup unit 20 or may be pre-loaded in memory of, e.g., the RMC 22, or may be retrieved from a database or otherwise made available. In some embodiments, sensors may be used in the rack 10 to detect, measure, or otherwise provide the BBU profile 38 information.

The RMC 22 performs various functions to control rack power, utilizing the ability to communicate with the power supply units 18 and the battery backup units 20, and utilizing the various profile information, as further discussed below.

Figure 6:
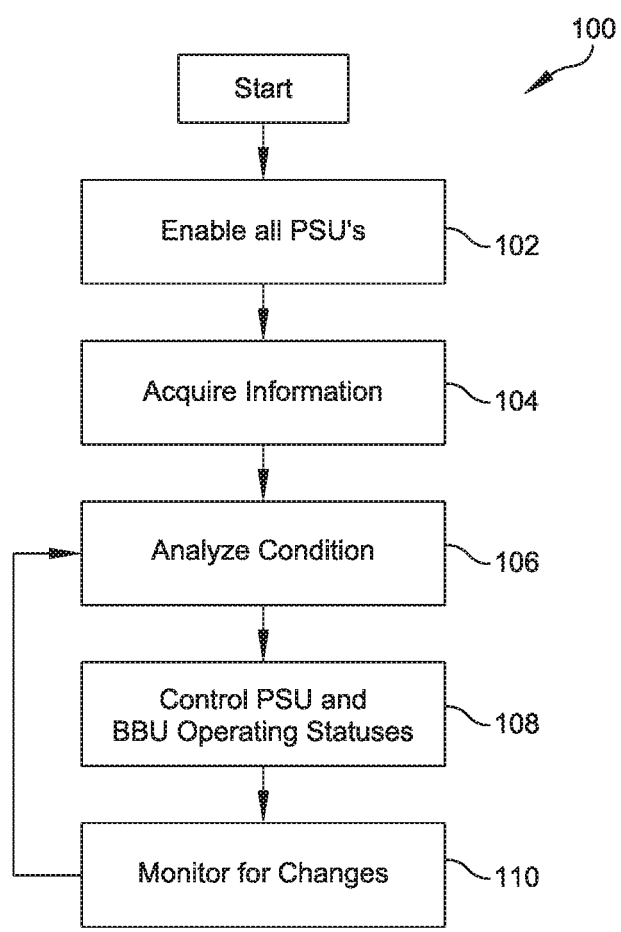
FIG. 6 is a flow diagram of one embodiment of a control method for a rack power system according to aspects of the current invention.

FIG. 6 is a flow diagram of a rack power system method 100 implemented in part by the RMC 22 according to various embodiments of the invention. The method starts by enabling all the power supply units 18 at block 102 upon, for example, the rack first being turned on, after which the power bus 12 will be energized by the power supply units 18 to provide power to the equipment 30. The method continues to block 104 where it acquires profile information. The profile information may include characteristics and active operating parameters of the main power 28, the power supply units 18, the battery backup units 20, and the equipment 30 as discussed above with respect to the input power profile 32, the load profile 34, the PSU profile 36, and the BBU profile 38. The RMC 22 analyzes in block 106 to determine a set of operating statuses for the various power supply units 18 and the battery backup units 20, as further discussed below, and the RMC 22 controls the operating statuses at block 108, by communicating to the various power supply units 18 and the battery backup units 20, via the control channel 26. At block 110, the RMC 22 monitors for changes in rack power system condition, as evidenced by continued monitoring of the profile information, and may re-analyze the operating condition and establish new operating statuses for the various power supply units 18 and the battery backup units 20.

With respect to block 110, the RMC 22 monitors for changes to the load drawn by the equipment 30, an unstable main power 28, an overload condition (where the load drawn by equipment 30 temporarily exceeds a threshold of capacity available from the power supply units 18, or the maximum power that can be provided while maintaining a desired redundancy), or other changes, and also monitors for returns to nominal conditions after such events. The analysis 106 and control 108 of operating statuses are further discussed below with respect to changes in load, unstable main power, and overload conditions.

The RMC 22 monitors load being drawn by the equipment 30 and determines a number of power supply units 18 to provide power to optimize system efficiency. For instance, each power supply unit 18 has an individual efficiency curve that may be available as discussed above, and for example, a typical efficiency curve shows maximum efficiency in a range between 30% and 50% of the maximum rated load of a typical power supply unit 18. The RMC 22 may optimize system efficiency by selecting individual power supply units 18 to provide power at any given moment, or by selecting what quantity, or number, of power supply units 18 should provide power at any given moment. For example, if the rack load, i.e., the power drawn by the equipment 30 as indicated by the load profile 34, is such that one power supply unit 18 operating at maximum output could support the load, the RMC 22 may nonetheless select and turn on three power supply units 18 so that each may operate in a more efficient power range, thus reducing total power drawn from the main power 28. As another example, if five power supply units 18 operating at full capacity are required to support the maximum rack load (100%) (e.g., based upon the equipment 30 installed in the rack 10), an active rack load of 30% may result in the RMC 22 selecting to turn on three power supply units 18 instead of powering on all five power supply units 18. The RMC 22 may have access to efficiency profiles of each power supply unit 18 as discussed above, or each model of power supply unit 18, or may be programmed with a nominal or typical efficiency profile.

The RMC 22 monitors main power 28 for quality and stability in an effort to predict or anticipate an impending failure or insufficiency. If the input power profile 32 indicates instability, the RMC 22 may configure one or more of the battery backup units 20 to operate in an online mode capable of making a faster transition to active mode than when in a standby mode. In active mode a battery backup unit 20 is actively providing power, for example at 12.5 volts, to the power bus 12. In standby mode a battery backup unit 20 is prepared to provide power upon a detected event, such as a failure in the main power 28 or a failure of one or more of the power supply units 18. In online mode a battery backup unit 20 is in a mode between standby and active where the battery backup unit 20 is not actively providing power but is in a state from which the battery backup unit 20 will more quickly transition to active mode than if the battery backup unit 20 were in standby mode.

For example, in accord with at least one embodiment of the invention, a battery backup unit 20 in online mode will present a voltage to the power bus 12 at a lower voltage than the power supply units 18. A specific example is a battery backup unit 20 presenting 12.0 volts to the power bus 12 while the power bus 12 is energized at 12.5 volts by the power supply units 18. Because the online battery backup unit 20 presents a lower voltage than already present on the power bus 12, the battery backup unit 20 will not be actively providing power to the equipment 30 via the power bus 12. If the main power 28 fails, or if the power supply units 18 fail to provide power, or if for any other reason the power bus 12 drops to 12.0 volts or lower, the battery backup unit 20 will provide power while in online mode, e.g., without having to detect any changes and without having to change modes. In such manner the battery backup unit 20 will provide power more quickly than if it were to transition from standby mode to active mode. To accommodate online mode, each battery backup unit 20 may be connected to the power bus 12 through a diode such that the higher voltage on the power bus 12 relative to the lower voltage presented by the battery backup unit 20 will cause the diode to be reverse biased. In other embodiments, various voltages may be used, a diode may or may not be present, or other forms of providing a quick transition to providing power may constitute online mode.

If the failure event described above continues, the battery backup unit 20 can transition to providing power at a full nominal voltage, e.g., 12.5 volts, and thereby ultimately enter an active mode. The RMC 22 continues to monitor the status and if normal power returns, e.g., via main power 28 and the power supply units 18, the RMC 22 may switch one or more of the battery backup units 20 back to standby mode. The RMC 22 may also select an optimum number of the battery backup units 20 to operate in an online mode based upon the load profile 34, and may also select an optimum number based upon a configured redundancy level. For example, the RMC 22 may control one or two battery backup units 20 to be in online mode while additional battery backup units 20 remain in standby mode.

In some embodiments, regular operation of the battery backup units 20 is independent of the RMC 22 or the ability to enter online mode. For example, regular operation of battery backup units 20 may be to detect power loss on the power bus 12 and in response change from a standby mode to an active mode as quickly as possible and of their own accord, without entering an online mode and without direction from the RMC 22. In some embodiments, the battery backup units 20 each have a battery management system (BMS) that controls and/or monitors charging and condition of the battery and may control the status of the battery backup unit 20 independently, or in conjunction with, or in cooperation with, the RMC 22. In other embodiments the battery backup units 20 may operate at the direction of the RMC 22.

The RMC 22 also monitors for an overload condition and may take action to prevent a shutdown due to the overload condition. For example, while the main power 28 is functioning normally and the load presented by the equipment 30 is supported by the power supply units 18, the load presented by the equipment 30 may increase beyond a threshold of the capacity that the power supply units 18 are able to provide, or beyond what would be in keeping with a required redundancy. In such a condition, a typical response may be a shutdown of the rack 10 or of individual equipment 30 for protection. In embodiments in accord with the invention, however, the RMC 22 may detect the overload condition and control one or more of the battery backup units 20 to enter an active mode to provide additional power, e.g., in addition to the power supply units 18, during the overload condition. The RMC 22 can detect the overload condition by its active monitoring of the load profile 34. As discussed above, the RMC 22 may continue to monitor the loading condition and when the loading returns to a normal range the RMC 22 can signal the one or more battery backup units 20 to return to a previous state or any desired state.

Various embodiments of the rack power system and method have been described above as providing 12 volts DC to equipment mounted in a rack. It will be appreciated that other embodiments may provide other voltages or be used in other applications to power other equipment. The system may be driven from a single phase of an AC main power utility or may be configured to accommodate 3-phase power. Additionally, the rack power system may provide power to more than one rack, or one rack may have more than one power system installed.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A rack power system for providing DC power to equipment installed in a rack, comprising:
    a first shelf containing a plurality of power supplies, each of the plurality of power supplies configured to receive AC power and to provide DC power to equipment installed in the rack at a nominal voltage;
    a second shelf containing a plurality of battery units, each of the plurality of battery units configured to provide DC power; and
    a controller coupled to the first shelf and the second shelf and configured to:
        control each of the plurality of power supplies and each of the plurality of battery units;
        monitor the AC power received by the first shelf;
        predict an impending event related to the AC power and, in response, control at least one of the plurality of battery units to operate in an online mode to generate a DC voltage less than the nominal voltage;
        detect a loss of AC power and, in response, control the plurality of battery units to operate in an active mode to generate a DC voltage at the nominal voltage.

2. The rack power system of claim 1, wherein the plurality of power supplies are configured to provide DC power to a DC power bus, and wherein the controller is further configured to control at least one of the plurality of battery units to operate in the online mode to present DC power to the DC power bus at a DC voltage less than the nominal voltage.

3. The rack power system of claim 1, wherein the plurality of power supplies are configured to provide DC power to a DC power bus, and wherein the controller is further configured to detect an overload condition and control at least one of the plurality of battery units to operate in the active mode to provide DC power to the DC power bus at the nominal voltage.

4. The rack power system of claim 1, wherein the plurality of power supplies are configured to provide DC power to a DC power bus, and wherein the controller is further configured to detect operation of the rack power system at a power level less than a full power level, and in response, control the first shelf to operate in an efficient mode of operation and control at least one of the plurality of power supplies to operate in a mode in which the at least one of the plurality of power supplies does not provide DC power.

5. The rack power system of claim 1, wherein the plurality of power supplies are configured to provide DC power to a DC power bus, and wherein the controller is configured to detect loss of AC power, and in response, control the plurality of battery units to operate in the active mode to provide DC power to the DC power bus at the nominal voltage.

6. The rack power system of claim 2, wherein:
    the first shelf is further configured to accept at least one battery unit;
    the first shelf and the second shelf are each configured to be slidingly mounted within the rack; and
    the first shelf and the second shelf are each configured to couple to the DC power bus when in a fully inserted position.

7. The rack power system of claim 1, wherein each of the plurality of power supplies has the same power rating as each of the plurality of battery units.

8. A method for providing power to equipment installed in a rack, the method comprising:
    mounting a first shelf into the rack, the first shelf containing a plurality of power supplies, each of the plurality of power supplies configured to receive AC power and to provide DC power to equipment installed in the rack at a nominal voltage;

mounting a second shelf into the rack, the second shelf containing a plurality of battery units, each of the plurality of battery units configured to provide DC power;

independently controlling each of the plurality of power supplies and each of the plurality of battery units;

monitoring the AC power received by the first shelf;

predicting an impending event related to the AC power and, in response, controlling at least one of the plurality of battery units to operate in an online mode to generate a DC voltage less than the nominal voltage; and detecting a loss of AC power and, in response, controlling the plurality of battery units to operate in an active mode to generate a DC voltage at the nominal voltage.

9. The method of claim 8, further comprising:
controlling at least one of the plurality of power supplies to provide DC power at the nominal voltage to a DC power bus in the rack; and
controlling at least one of the plurality of battery units to operate in the online mode to present DC power to the DC power bus at a DC voltage less than the nominal voltage.

10. The method of claim 8, further comprising:
controlling at least one of the plurality of power supplies to provide DC power at the nominal voltage to a DC power bus in the rack;
detecting an overload condition; and
controlling at least one of the plurality of battery units to operate in the active mode to provide DC power to the DC power bus at the nominal voltage in response to the overload condition.

11. The method of claim 8, further comprising:
controlling at least one of the plurality of power supplies to provide DC power at the nominal voltage to a DC power bus in the rack; and
detecting operation of the first shelf at a level less than a full power level, and in response controlling at least one of the plurality of power supplies to operate in a mode in which the at least one of the plurality of power supplies does not provide DC power to the DC power bus.

12. The method of claim 8, further comprising:
controlling at least one of the plurality of power supplies to provide DC power at the nominal voltage to a DC power bus in the rack; and
detecting a loss of AC power, and in response controlling the plurality of battery units to operate in the active mode to provide DC power to the DC power bus at the nominal voltage.

13. The method of claim 8, further comprising:
mounting a DC power bus in the rack;
wherein the first shelf further contains at least one battery unit;
wherein mounting a first shelf into the rack includes sliding the first shelf into the rack and coupling a connector of the first shelf with the DC power bus; and
wherein mounting a second shelf into the rack includes sliding the second shelf into the rack and coupling a connector of the second shelf with the DC power bus.

14. The method of claim 8, wherein each of the plurality of power supplies has the same power rating as each of the plurality of battery units.

15. An equipment rack, comprising:
a frame;
a pair of mounting rails coupled to the frame;
a first shelf mounted to the mounting rails and containing a plurality of power supplies, each of the plurality of power supplies configured to receive AC power and to provide DC power to equipment installed in the equipment rack at a nominal voltage;
a second shelf mounted to the mounting rails and containing a plurality of battery units, each of the plurality of battery units configured to provide DC power; and
a controller coupled to the first shelf and the second shelf and configured to:
control each of the plurality of power supplies and each of the plurality of battery units;
monitor the AC power received by the first shelf;
predict an impending event related to the AC power and, in response, control at least one of the plurality of battery units to operate in an online mode to generate a DC voltage less than the nominal voltage; and
detect a loss of AC power and, in response, control the plurality of battery units to operate in an active mode to generate a DC voltage at the nominal voltage.

16. The equipment rack of claim 15, further comprising a DC power bus mounted in the equipment rack and configured to distribute DC power to equipment mounted to the mounting rails in the equipment rack;
wherein the plurality of power supplies are configured to provide DC power to the DC power bus; and
wherein the controller is further configured to control at least one of the plurality of battery units to operate in the online mode to present DC power to the DC power bus at a DC voltage less than the nominal voltage.

17. The equipment rack of claim 15, further comprising a DC power bus mounted in the equipment rack and configured to distribute DC power to equipment mounted to the mounting rails in the equipment rack;
wherein the plurality of power supplies are configured to provide DC power to the DC power bus; and
wherein the controller is further configured to detect an overload condition and control at least one of the plurality of battery units to operate in the active mode to provide DC power to the DC power bus at the nominal voltage.

18. The equipment rack of claim 15, wherein the plurality of power supplies are configured to provide DC power to a DC power bus, and wherein the controller is further configured to detect operation at a power level less than a full power level, and in response, control the first shelf to operate in an efficient mode of operation and control at least one of the plurality of power supplies to operate in a mode in which the at least one of the plurality of power supplies does not provide DC power.

19. The equipment rack of claim 15, wherein the plurality of power supplies are configured to provide DC power to a DC power bus;
wherein each of the plurality of power supplies has the same power rating as each of the plurality of battery units; and
wherein the controller is configured to detect loss of AC power, and in response, control the plurality of battery units to operate in the active mode to provide DC power to the DC power bus at the nominal voltage.

20. The equipment rack of claim 16, wherein:
the first shelf and the second shelf are each further configured to be slidingly mounted to the mounting rails; and
the first shelf and the second shelf are each further configured to couple to the DC power bus when slid to a fully inserted position.

* * * * *